United States Patent [19]
Lee et al.

[11] Patent Number: 6,014,768
[45] Date of Patent: Jan. 11, 2000

[54] MOVING REFERENCE CHANNEL QUALITY MONITOR FOR READ CHANNELS

[75] Inventors: Thean-Liang Lee, Sunnyvale; David S. Rosky, Nevada City, both of Calif.

[73] Assignee: Texas Instruments Incorporated, Dallas, Tex.

[21] Appl. No.: 08/794,511

[22] Filed: Feb. 4, 1997

[51] Int. Cl.[7] ............................ G06F 11/10; H03M 13/12
[52] U.S. Cl. .......................................... 714/795; 714/746
[58] Field of Search ..................................... 714/795, 746

[56] References Cited

U.S. PATENT DOCUMENTS

| | | | |
|---|---|---|---|
| 5,341,379 | 8/1994 | Crisp | 714/709 |
| 5,537,129 | 7/1996 | Okada et al. | 345/90 |

*Primary Examiner*—Phung M. Chung
*Attorney, Agent, or Firm*—W. Daniel Swayze, Jr.; Wade James Brady, III; Richard L. Donaldson

[57] ABSTRACT

The present invention provides a method and apparatus for monitoring a read channel in a disk drive system and calibrating the disk drive system. In one embodiment, a comparator circuit is provided to detect the data samples, that fall within a pre-programmed, variable-width distribution window. The output of the comparator circuit is digitized and sent to a logic block to qualify the valid samples. A relative counter or histogram of the detected data samples is obtained. The valid sample count is fed to a counter that can be accessed via a serial port. The channel parameters can be adjusted based upon a relative figure of merit read off the serial port that reflects the distribution of the samples with respect to the target value after processing a statistically valid number of samples. An embodiment of the invention provides a slicer circuit which generates an ideal waveform that tracks the input signal. The ideal waveform constitutes a moving reference for comparison with the sampled signal in a channel quality monitor. The moving reference signal reduces hardware requirements in the comparing circuitry of the channel quality monitor. Further, hardware utility is optimized in an embodiment by driving an AGC tuning loop, an LMS filter tuning loop, and a channel quality monitor circuit from the same slicer circuit.

21 Claims, 9 Drawing Sheets

MOVING REFERENCE CHANNEL QUALITY MONITOR FOR READ CHANNELS

BACKGROUND OF THE INVENTION

1. Field of the Invention

The present invention relates to the field of signal processing, and in particular, to signal processing in a read channel.

2. Background

Digital transmission is often performed through analog channels. Digital information is transmitted over the analog channel in the form of a "symbol" representing a digital value. In some cases, adjacent symbols can overlap, resulting in a phenomenon known as intersymbol interference. This interference can corrupt digital transmissions, leading to errors in the receipt of the digital information. An efficient mechanism for optimizing the channel is needed.

Partial response signaling allows for better handling of intersymbol interference as well as more efficient utilization of the bandwidth of a given channel. In partial response systems, a controlled amount of intersymbol interference can be allowed. The partial response system is described by the polynomials 1+D, 1−D and (1−$D^2$), also called duobinary, dicode, and class-IV, respectively.

Precoding is often performed to take full advantage of partial response signaling. With preceding, a method is required for decoding the binary symbol sequence that is output from the channel in its corrupted form. For example, in a magnetic recording channel, maximum likelihood sequence estimation (MLSE) decoding, in conjunction with partial response signaling systems, can be used as an effective tool in pulse detectors for receiving and decoding digital transmissions that suffer from intersymbol interference.

For example, class IV partial response waveforms are formed by the subtraction of binary waveforms two bit intervals apart. This process boosts midband frequencies making the system more immune to noise and distortion at both high and low frequencies. This is especially useful in a magnetic recording channel where, using a conventional inductive head, there is little signal at low frequencies and spacing losses can cause large attenuation at high frequencies.

Because class IV partial response signaling for digital detection is especially suited for the magnetic recording channel, sampled amplitude detection can be applied for magnetic recording. To minimize the propagation of data errors, the signal is turned into a sequence of binary numbers. Procedures for determining the maximum likelihood sequence in the presence of noise can then be applied. With sequence detection, sequences of bits are detected and processed to minimize error.

Figure 15:
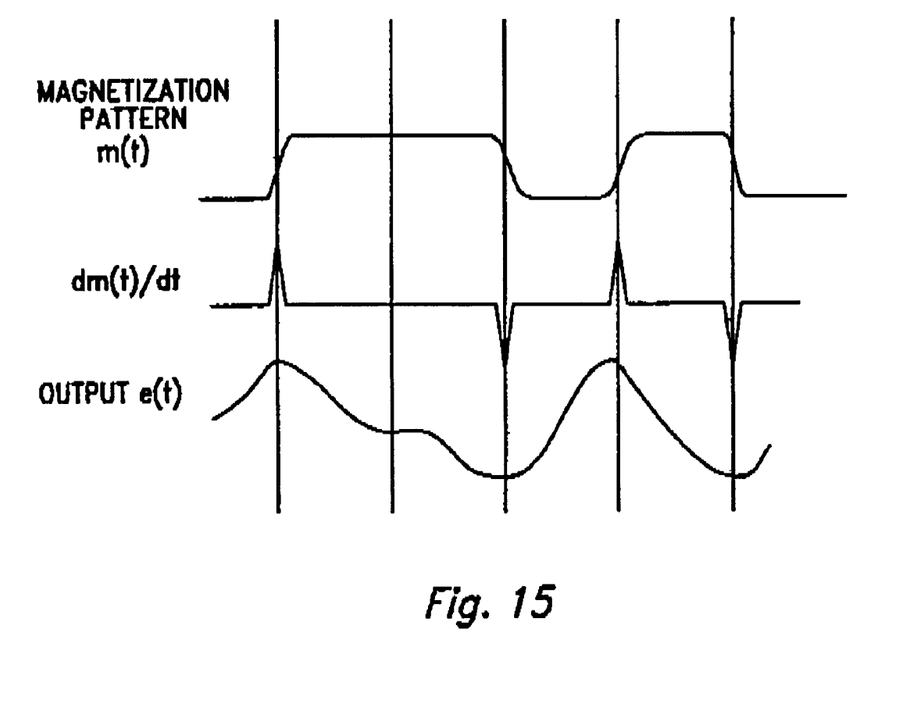
FIGS. 15 shows a magnetization pattern m(t) in a digital magnetic recording system where information bits are recorded on a medium using two stable states f magnetization.

In a digital magnetic recording system, information bits are recorded on a medium using two stable states of magnetization. For example, using the NRZ (Non-return-to-Zero) recording method, magnetization pattern m(t) can be created as shown in FIG. 15. m(t) can be represented as $$m(t) = \sum_{k=0}^{\infty} (a_k) \cdot u(t - kT) \quad (1)$$

where u(t) is a rectangular pulse of duration T:

$$u(t) = \begin{cases} 1 & \text{for } 0 \leq t \leq T \\ 0 & \text{otherwise} \end{cases}$$

and the coefficients $a_k$ represent the binary magnetization level from time kT to time kT+T:

$$a_k = \begin{cases} 1 & \text{for positive magnetic orientation} \\ 0 & \text{for negative magnetic orientation} \end{cases}$$

In reading back the recording pattern, the output voltage e(t) is given by:

$$e(t) = \left[\frac{d}{dt}m(t)\right] * h(t) \quad (2)$$

where h(t) represents the magnetic field response to a unit step function and * represents a convolution operation. Combining equations (1) and (2) yields:

$$e(t) = h(t) * \left[\sum_{k=0}^{\infty} a_k \{\delta(t - kT) - \delta(t - kT - T)\}\right]$$

$$= \sum_{k=0}^{\infty} x_k h(t - kT)$$

$$x_k = \begin{cases} a_k - a_{k-1} & \text{for } k \geq 1 \\ a_0 & \text{for } k = 0 \end{cases}$$

$x_k$ can have three different levels of −1, 0, or +1 (note: −1, 0 and +1 are symbolic voltage levels, not actual voltage values). The $x_k$ sequence, however, is not generated nor observed in the recording system.

Figure 12:
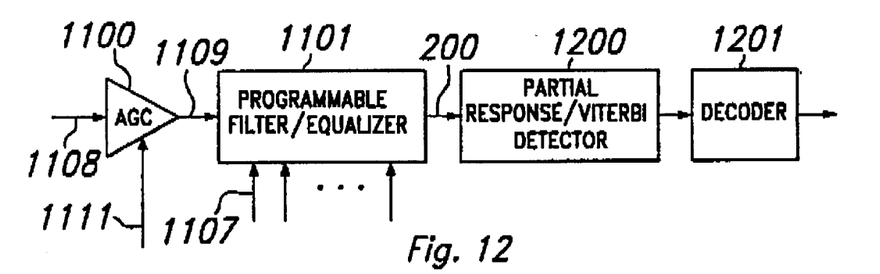
FIG. 12 is a block diagram of a PRML read channel.

An example of a PRML (Partial Response Maximum Likelihood) read channel for processing the signal e(t) is shown in FIG. 12. The read signal e(t) is provided to AGC (automatic gain control) amplifier 1100 via input 1108. The gain of AGC amplifier 1100 is controlled via signal 1111. Amplified output 1109 of AGC amplifier 1100 is provided to programmable filter/equalizer 1101 to shape the read signal waveform into the desired target waveform. Filter/equalizer 1101 has adjustable filter tap coefficients controlled via lines 1107 for modifying the filter/equalizer transfer function. The filtered data signal 200 from filter/equalizer 1101 is provided to PRML/Viterbi Detector 1200, and subsequently to decoder 1201, for detection of the sequence $x_k$ and reconstruction of the digital information.

AGC amplifier 1100 and filter/equalizer 1101 are adjusted so that data signal 200 more closely approximates the waveform expected by detector 1200. Thus, the accuracy of detector 1200 is dependent on the efficient tuning of AGC amplifier 1100 and filter/equalizer 1101.

The read signal e(t) of FIG. 15 is sampled and quantized to generate raw data samples of the $x_k$ sequence. Because the $x_k$ sequence likely contains errors, and the retrieval of the recorded information requires accurate detection of pulse sequences, maximum likelihood sequence estimation (MLSE) techniques, such as the Viterbi algorithm, are used in detector 1200 to improve the detection of symbol (pulse) sequences in the presence of noise and intersymbol interference. The $x_k$ sequence is fed to a decoding stage, such as decoder 1201, to retrieve the original information as accurately as possible.

In one embodiment of Viterbi decoding, the received data is sampled and quantized to three-bit accuracy, and path metric calculations are performed on the data using digital electronics. Typically, data is not decoded as soon as it is received. Instead, a sequence of data following the digit to be decoded is first collected. By computing path metrics (the accumulated log likelihood), a limited number of possible sequences are identified with one survivor sequence ending in each of the data states. The highest correlated of the survivor sequences is selected to be the sole survivor sequence. However, for an ML sequence estimator or a Viterbi detector to accurately reproduce the original information, the $x_k$ sequence needs to be sampled from the incoming analog signal waveform at precise locations.

An MLSE detection technique such as the Viterbi algorithm is used because the transmission path or channel typically introduces transmission errors and corrupts the original data when the coded information is transmitted from a source to a destination. The various ways in which digital data can be conveyed make it more difficult to identify and compensate for errors because of the many different error mechanisms associated with them.

For example, in magnetic recording, error sources can range from mechanical problems such as poor read/write head contact and flux density variations in a disk drive to Gaussian noise in replay circuits and heads. Whether it is a mechanical problem or Gaussian thermal noise, the result is corrupted data on the receiving side that is not the same as the originally transmitted data.

These errors stemming from various causes can be compensated to minimize detection errors at the output of a Viterbi detector by adjusting some front end parameters including those in the AGC, equalization, sampling arid quantization stages. Fine tuning a whole read channel system, however, can include adjusting hundreds of parameters. Fine tuning a disk drive system for even lower error rates may involve adjusting more than two thousand parameters.

Figure 13:
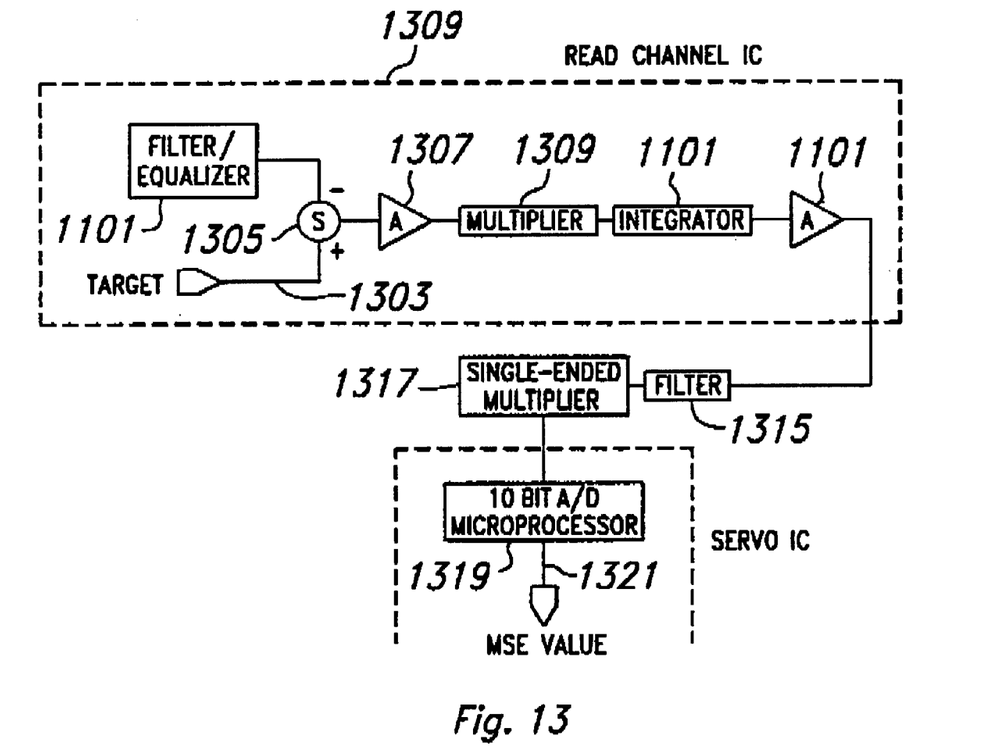
FIG. 13 is a block diagram of a prior art read channel monitor system that uses a MSE (Mean Square Error) technique for PRML systems.

FIG. 13 is a block diagram of a prior art read channel monitor system using the MSE (Mean Square Error) technique for PRML systems. Since PRML read channel systems are often implemented in analog circuitry, the MSE signal of the input data samples is also analog. The analog MSE implementation shown in FIG. 13 for a PRML sampled read channel comprises differential subtractor 1305 and gain stage 1307 to obtain the difference between equalizer 1101 output and the target Viterbi sampled value 1303. An analog multiplier 1309 coupled to gain stage 1307 performs the squaring of the error signal.

The outputs of multiplier 1309 are fed to an on-chip integrator 1311 to obtain an analog MSE signal. The differential analog MSE signal is then brought off-chip via a differential analog output buffer 1313 to an off-chip filter 1315. The filtered MSE signal goes through a differential to single-ended analog conversion before digitizing by the servo A/D and further processing by DSP microprocessor 1319.

The MSE scheme of FIG. 13 is prone to error due to poor signal-to-noise ratio (SNR) caused by the small voltage difference between the sample and the target value, typically down to a few millivolts as the data samples come close to the target. The analog summing and multiplying stages add additional noise and offset to the MSE signal, making it difficult to filter, and the long analog MSE signal path is susceptible to degradation from other on-chip noise sources such as clocks and digital signal lines. Also, the SNR of the analog MSE decreases as the channel approaches ideal equalization, which decreases the accuracy of the MSE measurement at the very point where it is desired to have the system operate.

Experiments using an SSI 4910 PRML channel, manufactured by Silicon Systems, Inc., verify that the MSE method has relatively low sensitivity and does not provide a single optimum solution for the continuous time filter cutoff and boost. As can be inferred from FIG. 13, the analog MSE solution is hardware-intensive with both on-chip and off-chip components.

An alternative approach to the analog MSE solution is to use a high-resolution analog-to-digital converter (ADC) to quantize the incoming signal, and perform digital operations of summing, multiplying, and averaging using hardware. This, however, is also a hardware-intensive solution, especially with the need for a high resolution ADC.

Viterbi Threshold Marginalization techniques can be used to optimize the PRML read channel, as suggested by Z. Keirn, et al. in "A Window-Margin Like Procedure . . . ", IEEE Transactions. on Magnetics, 3/95. Using this technique, the Viterbi threshold can be increased about 50% to marginalize the channel performance, and optimize the channel for $10^{-6}$ BER (bit error rate) performance by mapping the BER contours with respect to the parameters in question. The optimized setting maps to a $10^{-9}$ range BER once the Viterbi threshold is returned to normal. The lower BER target reduces the tuning time of the hard disk drive, resulting in cost reduction in manufacturing.

However, the threshold marginalization technique of Kiern et al. interferes with the normal operation of the channel, and requires external custom software and hardware to process the data. It is also known that Viterbi marginalization is not always an accurate predictor with respect to the channel BER, and does not always map to the lowest MSE and BER.

Figure 14:
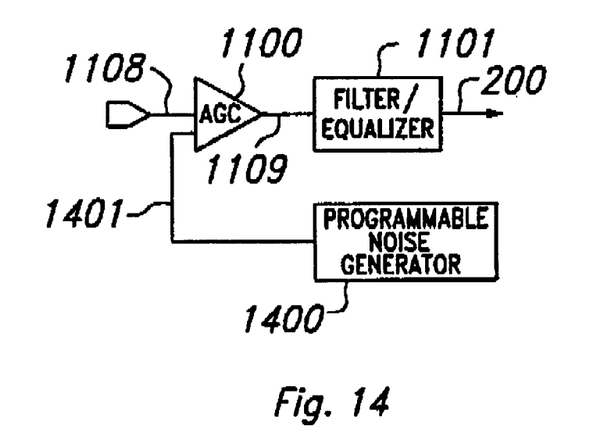
FIG. 14 shows a block diagram of a prior art channel marginalization system that adds white Gaussian noise to the input signal.

Another channel marginalization technique is to add white Gaussian noise to the input signal as shown in FIG. 14, degrading the input SNR. This method is used in some advanced PRML systems by summing in the output (1401) from a programmable noise generator (1400) before the equalization step. In FIG. 14, the noise generator output 1401 is summed with the input signal 1108 in AGC amplifier 1100. The amplified input signal and noise are provided to filter/equalizer 1101, and, hence, the rest of the channel, via line 1109. By adding noise to the system and optimizing the channel for a $10^{-6}$ range BER, the drive tune time can be reduced. The noise generator, however, disturbs the normal analog signal path and the operation of the read channel, and the effects of channel tuning may not have a one-to-one mapping once the noise source is removed from the read channel.

Further, in this noise generator method, the summing circuit and the noise generator can be a source of error themselves, and may degrade the performance of the channel during normal operations. Additional external hardware and software are also required to extract the BER information from the raw channel output data, similar to Viterbi threshold marginalization.

Alternatively, the MSE of the sampled data can be used in combination with the noise generator for optimization. But again, the drawbacks of the analog MSE detract from the performance of such a system.

SUMMARY OF THE INVENTION

The present invention provides a method and apparatus for monitoring a read channel in a disk drive system and calibrating the disk drive system. In one embodiment, a comparator circuit is provided to detect the data samples that fall within a pre-programmed distribution window from a number of sectors in each zone of a disk. The output of the comparator circuit is digitized and sent to a logic block to qualify the valid samples. A relative counter or histogram of the detected data samples is obtained. The valid sample count is fed to a counter that can be accessed via a serial port. The channel parameters can be adjusted based upon a relative figure of merit read off the serial port that reflects the distribution of the samples with respect to the target value after processing a statistically valid number of samples.

Once the initial calibration tunes the read channel such that most of data samples are valid, the apparatus can be switched to count the number of invalid samples that fall outside the distribution window. Based upon the invalid sample count, fine tuning of the read channel system is performed so that the invalid sample count decreases and reaches an acceptable value. An embodiment of the invention can be fully self-contained on chip if desired. An advantage of the invention is that the analog signal path of the sampled data and the read channel operation are not disturbed by a noise generator, or sub-optimal Viterbi threshold settings.

An embodiment of the invention provides a slicer circuit which generates an ideal waveform that tracks the input signal. The ideal waveform constitutes a moving reference for comparison with the sampled signal in a channel quality monitor. The moving reference signal reduces hardware requirements in the comparing circuitry of the channel quality monitor. Further, hardware utility is optimized in an embodiment by driving an AGC tuning loop, an LMS filter tuning loop, and a channel quality monitor circuit from the same slicer circuit.

BRIEF DESCRIPTION OF THE DRAWINGS

FIGS. 8A and 4B are a circuit diagram of an embodiment of a differential comparator circuit with latching circuitry.

DETAILED DESCRIPTION OF THE PRESENT INVENTION

A moving reference channel quality monitor for read channels is described. In the following description, numerous specific details are set forth in order to provide a more thorough understanding of the present invention. It will be apparent, however, to one skilled in the art, that the present invention may be practiced without these specific details. In other instances, well known features have not been described in detail so as not to obscure the present invention.

One embodiment of the invention is used as part of a read channel for data recovery in a magnetic data storage system. It will be apparent to one skilled in the art, however, that the invention is suitable for other circuits employing multi-level threshold and window comparisons, and is extendible to any number of threshold or window levels. In the following embodiment, the invention is applied to partial response systems such as described by the polynomials 1–D, 1+D, $(1-D^2)$, also called duobinary, dicode, and class-IV, respectively. Further, the invention is not limited to the NRZ scheme, and can be applied in conjunction with any other suitable recording methods such as FSK (Frequency Shift Keying) and Manchester coding.

A method and apparatus are described for monitoring read channel quality to map disk drive defects with read channel parameters. Tuning of a large number of parameters of a disk drive system can thus be performed in an efficient manner with reduced tuning time.

In one embodiment, the quality of a read channel is monitored by counting the number of detection errors for a desired target window centered about an ideal reference. The number of detection errors are output through a serial port to provide an effective indicator of the system performance. Using the number of detection errors read off the serial port, a relative figure of merit can be calculated so that fine tuning of a disk drive system can be executed efficiently. Further, monitoring specifications may be made more stringent or relaxed by adjusting the width of the target window.

Figure 16:
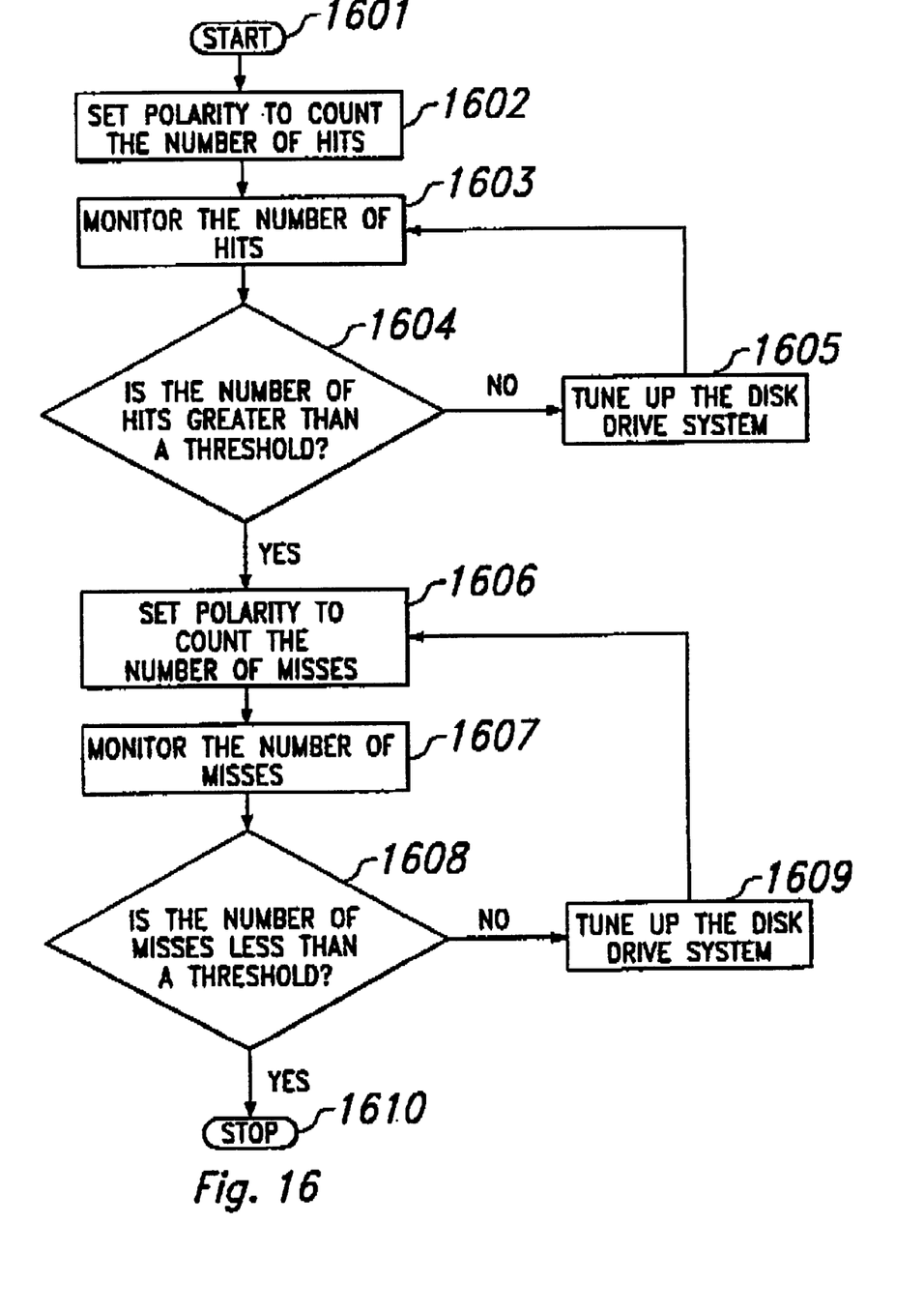
FIG. 16 is a flowchart for system calibration in an embodiment of the invention.

FIG. 16 is a flowchart for system calibration in one embodiment of the invention. When starting to tune a read channel system, typically, many sample values miss the target window. Accordingly, the polarity is adjusted to count the number of "hit" samples at step 1602. At step 1603, the number of "hit" samples are monitored and read. After processing a statistically valid number of samples, the count value read represents a relative figure of merit that reflects the distribution of samples with respect to the target value. At step 1604, a determination is made regarding whether the number of hits is greater than a threshold value. If not, at step 1605, tuning of appropriate disk drive system parameters is performed to raise the number of "hits." Appropriate channel parameters may be varied for fine tuning of the system based upon the relative figure of merit.

If the number of hits is greater than the threshold value, then the polarity is set to count the number of "miss" samples at step 1606. The number of "miss" samples is monitored at step 1607, and the disk drive system is tuned at step 1609 until an acceptable level of "miss" samples is reached at step 1608.

The threshold value to test the number of hit samples can be set to any appropriate value. For example, when the number of "hits" begins to level off with no apparent improvement despite continued system tuning, the system is switched to a "miss" monitoring mode. Looking at the "missed" samples can maximize the counter range when most samples are hitting the target. Further, when the number of "miss" samples becomes relatively small with respect to the counter range, the window width may be decreased, via a programmable DAC (digital-to-analog converter) accessible from the serial port, for finer evaluation.

More complex statistical analysis can be performed by collecting and analyzing the monitored data over time using an appropriate statistical analysis method. The method of FIG. 16 may be implemented in software executed by a processor, such as a standard PC, coupled to the serial port to interface with the channel quality monitor circuit.

Figure 1:
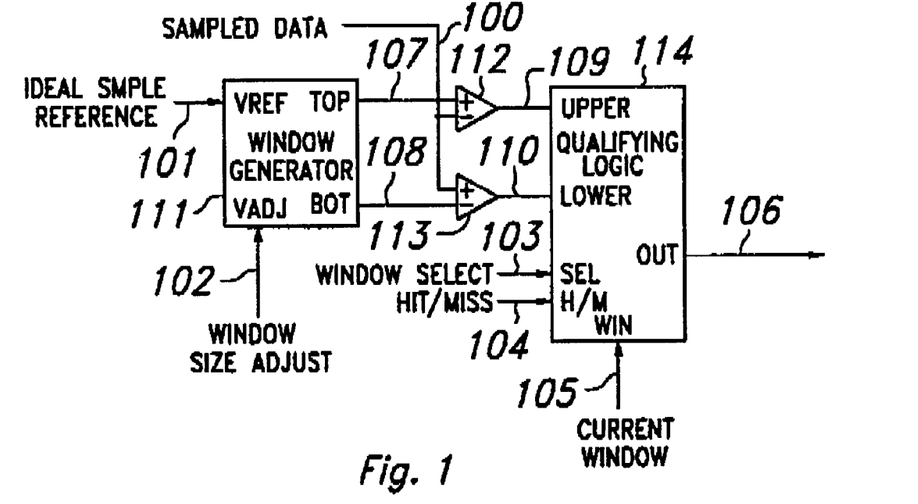
FIG. 1 is a block diagram of an embodiment of a moving reference window logic circuit.

FIG. 1 is a block diagram of an embodiment of moving reference window logic for use in comparing a sampled data signal with a data window centered on a moving reference. The diagram comprises window generator block 111, comparators 112 and 113, and qualifying logic 114. An ideal sample reference signal, such as that provided by a slicer, is provided to the VREF input of window generator 111 via input line 101. Window generator 111 further receives a window size adjust signal on a VADJ input via line 102.

Window generator 111 generates an upper window threshold signal from the TOP output, and a lower window threshold signal from the BOT output. The upper window threshold signal is provided to the positive input of comparator 112 via line 107, whereas the lower window threshold signal is provided to the negative input of comparator 113 via line 108. The upper and lower threshold voltages are offset above and below the ideal sample reference voltage, respectively, by a variable offset value dependent on the window size adjust signal on line 102.

The sampled data signal is provided to the negative input of comparator 112 and the positive input of comparator 113 via line 100. The sampled data signal is typically delayed, such as by a chain of sample and hold circuits, in order to coincide with the corresponding ideal sample reference signal on line 101 and the respective upper and lower threshold signals on lines 107 and 108. The output of comparator 112 is coupled to the UPPER input of qualifying logic 114 via line 109. The output of comparator 113 is coupled to the LOWER input of qualifying logic 114 via line 110.

In this embodiment, the inputs to comparators 112 and 113 are analog signals, whereas the outputs of the comparators are digital signals. The output of comparator 112 is high, i.e., a digital "1" value, when the sampled data input signal on line 100 is less than the upper threshold voltage of line 107. The output of comparator 112 is low, i.e., a digital "0", when the sampled data signal on line 100 is greater than the upper threshold signal of line 107. Similarly, the output of comparator 113 is high when the sampled data signal on line 100 is greater than the lower threshold signal on line 108, and is low when the sampled data signal on line 100 is less than the lower threshold signal on line 108.

A digital "1" corresponds to a "true" value for the respective comparator, whereas a digital "0" corresponds to a "false" value on the respective comparator. If either comparator tests false during a window comparison, then the sampled data signal is outside of the window. If both comparator outputs test true during a window comparison, then the sampled data signal is within the window.

In addition to receiving the comparator outputs on lines 109 and 110 at the UPPER and LOWER inputs, qualifying logic 114 receives window select signals 103 on the SEL input, and hit/miss control signals 104 at the H/M input. Further, digital signals indicating the current window are provided via line 105 to the WIN input of qualifying logic 114.

The window select signals on line 103 provides selective control over which window region is being analyzed, e.g., the +1 window, the −1 window, or the 0 window. The hit/miss control signal on line 104 provides for polarity control of the output on line 106. When the hit/miss signal selects analysis of window hits, the output signal on line 106 emits a digital pulse each time the sampled data signal is appropriately within the selected window. When the hit/miss signal selects analysis of misses, the output signal on line 106 emits a digital pulse each time the sampled data input is outside of the window selected by lines 103.

The current window information on line 105 is utilized in conjunction with window select information on line 103 to determine when the current window generated by window generator 111 matches the window selected by lines 103. During hit analysis, the digital pulse indicating a hit is disabled when the current window does not match the selected window.

The moving reference window logic provides hardware savings over static reference window schemes. Static reference window schemes require a pair of comparators for each possible reference level. The moving reference window logic utilizes one pair of comparators to perform all relevant window comparisons. The hardware savings is even greater in systems with more reference voltage levels.

Figure 2:
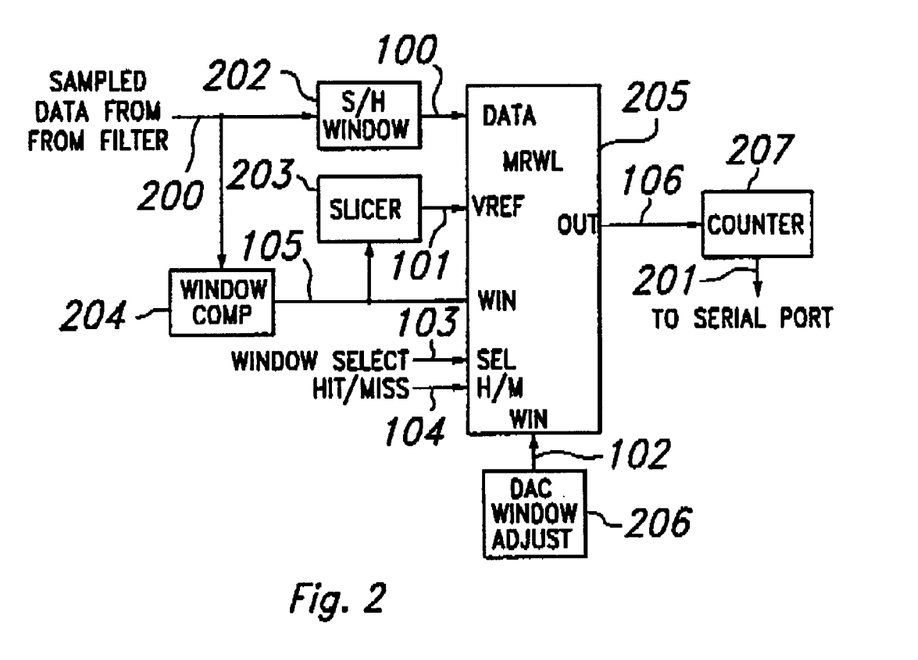
FIG. 2 is a block diagram of a channel quality monitor implementing moving reference window logic.

FIG. 2 is a block diagram of one embodiment of a channel quality monitor implementing the moving reference window logic of FIG. 1. Sampled data from the filter/equalizer is provided to a sample and hold chain 202 and window comparator circuit 204 via lines 200. Window comparator 204 divides the complete range of the input data into a series of contiguous windows, and determines which window the current sampled data lies within. The information on the current window is provided to slicer 203 and the WIN input of moving reference window logic 205 via line 105.

Slicer 203 provides the ideal sample reference voltage to the VREF input of moving reference window logic 205 via line 101. This ideal sample reference represents the ideal signal corresponding to the current window specified by line 105.

Sample and hold chain 202 provides the delayed sampled data to the DATA input of moving reference window logic 205 via line 100. The delay provided by sample and hold chain 202 is typically designed to match the delay of the window comparator circuit 204 and slicer circuit 203, such that the sampled data on line 100 corresponds to the ideal sample reference on line 101 and the current window data on line 105.

The output of moving reference window logic 205 is provided to counter 207 via line 106. Counter 207 counts either the hits or misses of the circuit depending on the hit/miss input provided to moving reference window logic 205 on line 104. The value of counter 207 is clocked into an output register at the end of a read cycle, and the counter value is read from the output register through a serial port via lines 201.

Digital-to-analog converter (DAC) 206 implements the window width adjustment mechanism by reading a digital input from an input register (not shown), also linked to the serial port, and providing an analog control signal to the VADJ input of moving reference window logic 205 via lines 102. The counter value from counter 207 may be used to implement adaptive feedback of the channel quality monitor by adjusting the DAC control value for DAC 206 based on the counter value. The window select information provided on lines 103, and the hit/miss information provided on lines 104, correspond to the identically labeled lines 103 and 104 described with respect to FIG. 1.

Figure 9:
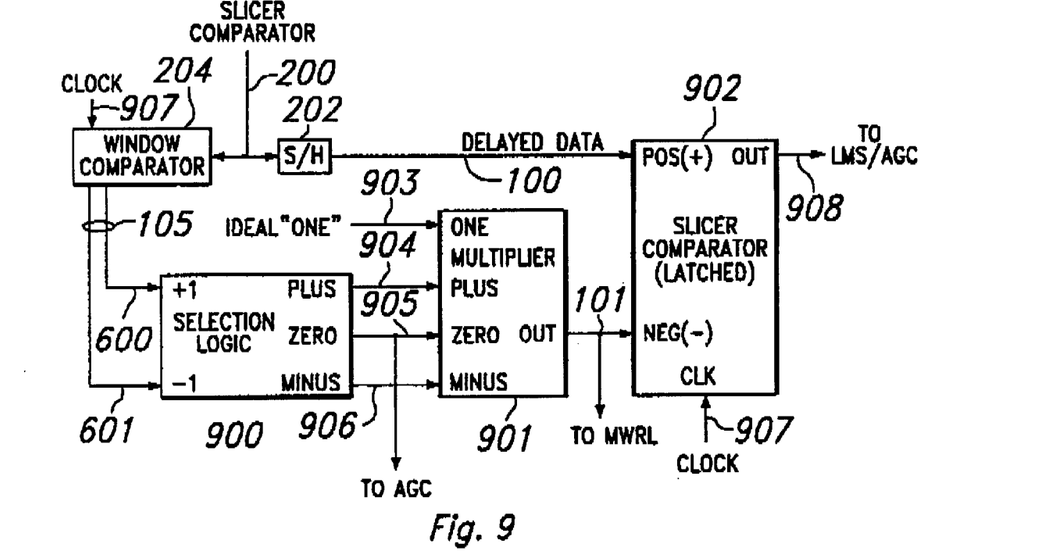
FIG. 9 is a block diagram of an embodiment of a window comparator and slicer circuitry for LMS and AGC update functions in a read channel.

As described with respect to FIG. 9, in typical channel quality monitoring analysis, upon startup, the number of hits for a specified window are counted and statistically analyzed to coarse tune the parameters of the read channel. Subsequently, the moving reference window logic can be adjusted to detect misses to utilize the full range of counter circuit 207. Statistical analysis of channel performance is then performed based on the number of misses in a read cycle.

Figure 3:
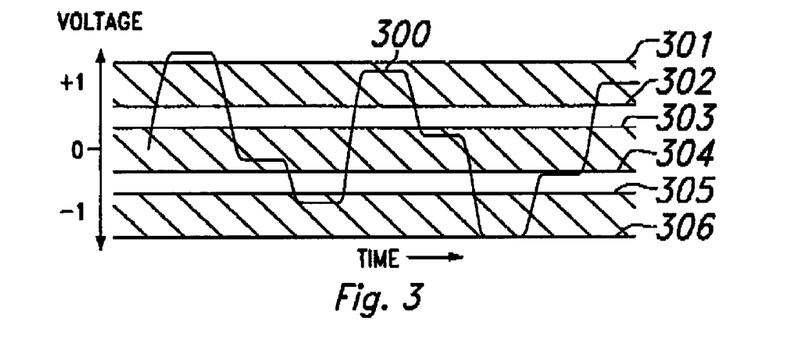
FIG. 3 is a waveform diagram of voltage versus time for a sampled data signal in a channel quality monitor with multiple windows having static voltage references.

FIG. 3 is a waveform diagram of voltage versus time for the sampled data signal. Also shown in FIG. 3 are the three voltage regions corresponding to static windows associated with the three levels of data: +1, 0, −1. Waveform 300 represents the sampled data signal. Voltage levels 301 and 302 represent the upper and lower threshold voltages, respectively, defining the window for data corresponding to +1. Similarly, voltages 303 and 304 represent the upper and lower threshold voltages, respectively, defining data corresponding to 0. Voltage levels 305 and 306 represent the upper and lower threshold voltages, respectively, defining the window for data corresponding to −1.

As shown, the windows of FIG. 3 are static in nature, being based on three stationary reference voltages. The widths of each window may be modified, but the center voltage does not change. To implement these three static windows, three separate window comparator circuits with individual center reference voltages are needed.

Figure 4:
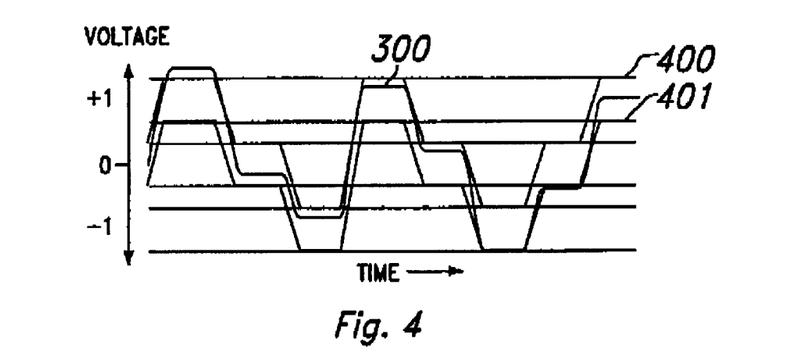
FIG. 4 is a waveform diagram of voltage versus time for a sampled data signal in a channel quality monitor implementing moving reference window logic.

FIG. 4 is a waveform diagram of one embodiment of the moving reference window logic. The sampled data signal is illustrated as waveform 300. Unlike the waveform diagram of FIG. 3, a single dynamic windowing waveform is shown. This dynamic waveform is bounded by the upper threshold voltage waveform 400 and lower threshold voltage waveform 401. As shown in the diagram, the windowing waveform tracks the sampled data waveform, obviating the need for multiple window comparator circuits. Thus, power and area requirements are reduced.

Figure 5A:
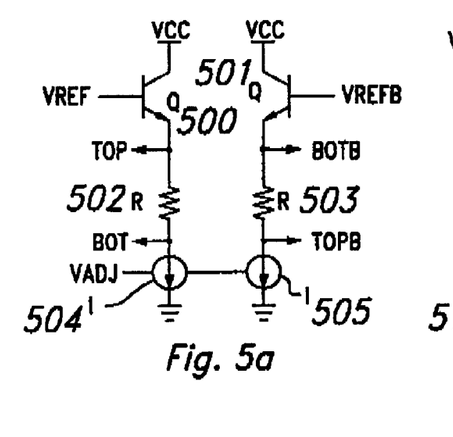
FIG. 5A is a circuit diagram of an embodiment of a differential window generator for use in moving reference window logic.
Figure 5B:
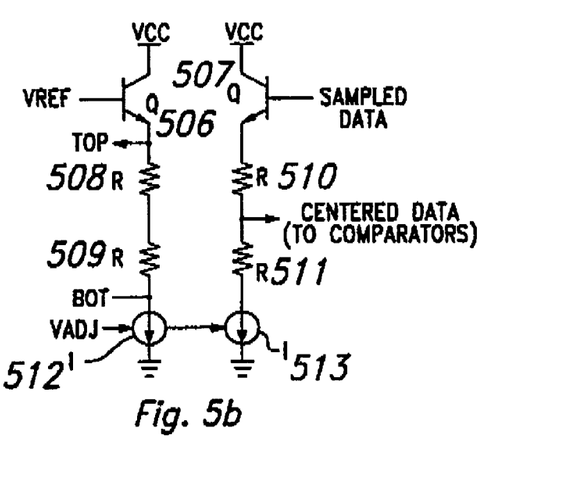
FIG. 5B is a circuit diagram of an embodiment of a non-differential window generator for use in moving reference window logic.

FIGS. 5A and 5B illustrate differential and non-differential window generator circuits, respectively. The differential window generator circuit of FIG. 5A comprises bipolar transistors Q500 and Q501, resistors R502 and R503, and variable current sources I504 and I505. The collectors of transistors Q500 and Q501 are coupled to the upper power supply, labeled VCC. The base of transistor Q500 is coupled to the positive differential input VREF, and the base of transistor Q501 is coupled to the negative differential input VREFB. The emitters of transistors Q500 and Q501 are coupled to resistors R502 and R503, respectively. Resistors R502 and R503 are further coupled to variable current sources I504 and I505, respectively. Current sources I504 and I505 are further coupled to the lower power supply. For control of the variable current sources, current sources I504 and I505 each receive control input VADJ.

The differential upper and lower threshold voltage values are tapped from the window generator circuit at the emitters of the transistors and at the nodes between the resistors and the current sources. Specifically, the positive upper threshold voltage (TOP) is taken from the emitter of transistor Q500, and the positive lower threshold voltage (BOT) is taken from the node connecting resistor R502 with current source I504. The negative lower threshold voltage (BOTB) is taken from the emitter of transistor Q501, and the negative upper threshold voltage (TOPB) is taken from the node coupling resistor R503 and current source I505.

The differential output threshold voltages are shown in the following equations in terms of the differential input comprising signals VREF and VREFB.

$$TOP - TOPB = (VREF - VBE) - (VREFB - VBE - IR) \quad (3)$$
$$= (VREF - VREFB) + IR$$

$$BOT - BOTB = (VREF - VBE - IR) - (VREF - VBE) \quad (4)$$
$$= (VREF - VREFB) - IR$$

where VBE is the base-emitter voltage of the transistor and IR is the voltage generated by current value I through resistor value R.

As shown in equations (3) and (4), the differential output threshold voltages are offset above and below the differential input reference voltage by IR, the voltage present across resistors R502 and R503. This offset voltage is proportional to the current drawn by current sources I504 and I505. Adjustment of this offset voltage and thus adjustment of the window width, is controlled by varying the current through current sources I504 and I505 via control input VADJ.

Because of the differential nature of the circuit of FIG. 5A, comparison with the differential sampled data signal may be performed without level shifting the sampled data input. However, in the non-differential system, the window generated from the moving reference input is level shifted such that the window is offset from the moving reference input, therefore the sampled data input is also level shifted accordingly.

In FIG. 5B, the window generator circuit comprises bipolar transistor Q506, resistors R508 and R509, and variable current source I512. The corresponding sampled data centering circuitry comprises bipolar transistor Q507, resistors R510 and R511, and variable current source I513. The collectors of transistors Q506 and Q507 are coupled to the upper power supply, labeled VCC. Moving reference voltage input VREF is coupled to the base of transistor Q506, and the sampled data input is coupled to the base of transistor Q507. Resistors R508 and R509 are coupled in series between the emitter of transistor Q506 and current source I512. Resistors R510 and R511 are coupled in series between the emitter of transistor Q507 and current source I513. Current sources I512 and I513 are further coupled to the lower voltage supply. The window control signal VADJ is provided to both current sources I512 and I513.

The upper threshold voltage (TOP) is taken from the node coupling the emitter of transistor Q506 and resistor R508. The lower threshold voltage (BOT) is taken from the node coupling resistor R509 to current source I512. The centered data signal is taken from the node coupling resistor R510 to resistor R511. Resistors R508–R511 are typically of equivalent resistance values.

Equations (5) and (6) below represent the window width and window center voltage, respectively.

$$TOP - BOT = (VREF - VBE) - (VREF - VBE - 2IR) \quad (5)$$
$$= 2IR$$

$$(TOP + BOT)/2 = \{(VREF - VBE) + (VREF - VBE - 2IR)\}/2 \quad (6)$$
$$= VREF - VBE - IR$$

As shown, the width of the window generated is proportional to the current drawn through the resistors in the circuit. In this non-differential circuit, the center voltage of the window is offset from the moving reference input signal by one base-emitter drop of transistor Q506 and one resistor voltage drop across resistor R508. This offset is accounted for with the sampled data signal by the base-emitter drop of transistor Q507 and the resistor voltage drop across resistor R510. The resulting centered data signal is aligned with the center of the generated window. Thus, when the sampled data signal at the base of transistor Q507 is equal to the moving reference lo input VREF at the base of transistor Q506, the centered data signal, taken from the node between resistors R510 and R511, is equal to the voltage at the node between resistors R508 and R509, i.e., the center of the window.

Figure 6:
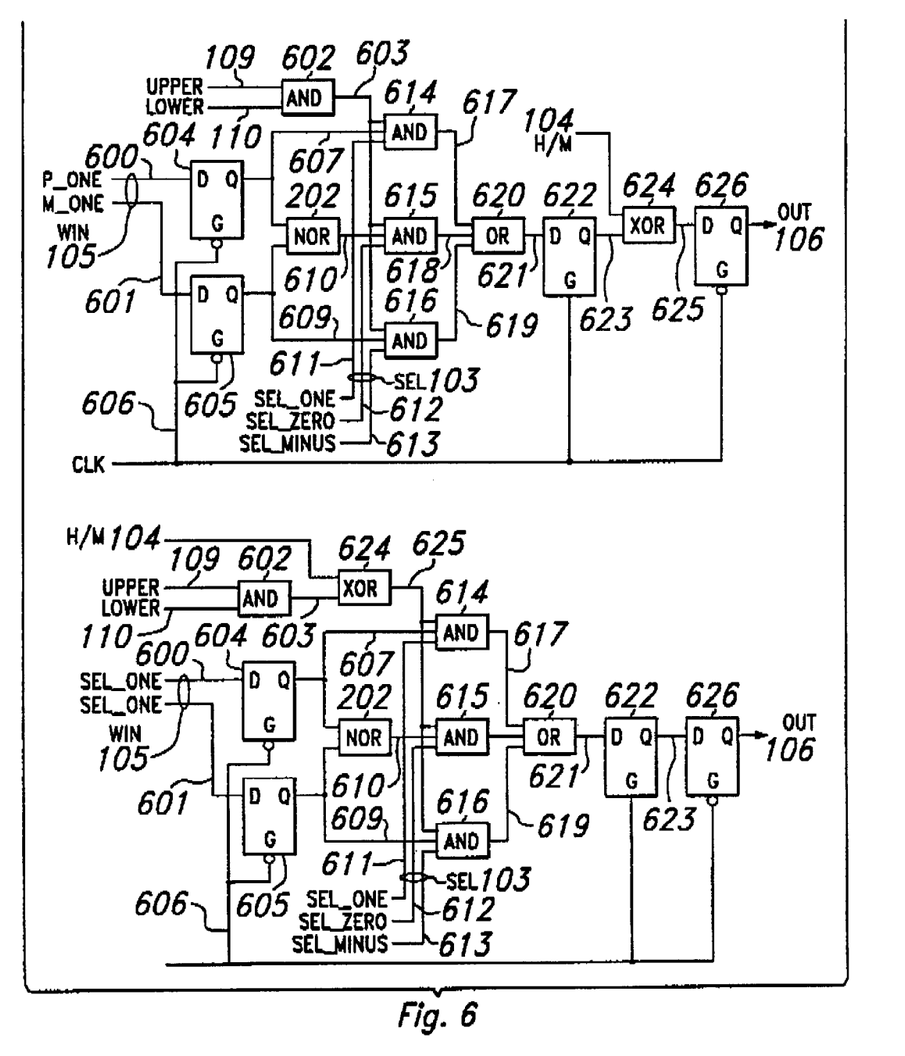
FIG. 6 is a block diagram of an embodiment of window qualifying logic for use in moving reference window logic.

FIG. 6 is a block diagram of one embodiment of the qualifying logic for the moving reference window logic of FIG. 1. In this embodiment, the qualifying logic comprises latches 604, 605, 622 and 626, AND gates 602 and 614–616, NOR gate 608, OR gate 620 and XOR gate 624.

The results of the comparison between the sampled data signal and the upper threshold voltage are provided to AND gate 602 via line 109 as signal UPPER. The results of the comparison between the sampled data signal and the lower threshold voltage are provided to AND gate 602 via line 110 as signal LOWER.

The output of AND gate 602 is true if the sampled data signal lies within the generated window, and false otherwise. The output of AND gate 602 is provided to the input of XOR gate 624 via line 603. Hit/Miss selection information is provided in the form of signal 14/M 104 to XOR 624. The output of XOR gate 624 is provided to the input of AND gates 614–616 via line 625. The current window information labeled WIN 105, comprises digital signals P_ONE on line 600 and M_ONE on line 601. P_ONE is true if the current window corresponds to the window for +1 valued data, and is provided to the D input of latch 604. M_ONE is true if the current window corresponds to −1 valued data, and is coupled to the D input of latch 605. The Q output of latch 604 is coupled to AND gate 614 and NOR gate 608 via line 607. The Q output of latch 605 is coupled to NOR gate 608 and AND gate 616 via line 609. The output of NOR gate 608 is coupled to AND gate 615 via line 610. The output of NOR gate 608 is true when the current window corresponds to 0 valued data.

Window select information labeled SEL 103, is provided in this embodiment in the form of individual window select signals SEL_ONE, SEL_ZERO, and SEL_MINUS, provided to AND gates 614, 615 and 616 via lines 611, 612, and 613, respectively. The outputs of AND gates 614, 615 and 616 are provided to OR gate 620 via lines 617, 618 and 619, respectively. The output of OR gate 620 is provided to the D input of latch 622 via line 621. The Q output of latch 622 is coupled to the D input of latch 626 via line 623. The Q output of latch 626 comprises the output signal OUT 106.

Clock signal CLK 606 is provided to the gating G input of latches 604, 605, 622 and 626. The gating inputs of latches 604, 605 and 626 are inverted, and thus gate the D inputs on the opposing phase of the clock signal pulse from that of latch 622.

The output of AND gate 602 is true whenever the sampled data lies within the window formed by the moving reference signal. XOR gate 624 is used to switch the polarity of the output of AND gate 602 to differentiate between hit analysis and miss analysis. AND gates 614–616 serve to qualify the hit or miss signal on line 625 such that a hit or miss is indicated only when the current window matches the selected window. Specifically, AND gate 614 passes a valid hit or miss signal only when the current window corresponds to the +1 window specified on lines 600 and 607, and the selected window is the +1 window as selected by signal SEL_ONE on line 611.

Further, AND gate 615 passes a valid hit or miss signal only when the current window corresponds to the 0 valued data window specified on line 610, and the selected window corresponds to the 0 valued window as specified by signal SEL_ZERO on line 612. AND gate 616 passes a valid hit or miss only when the current window corresponds to −1 data as specified on lines 601 and 609, and the selected window corresponds to −1 data as specified by signal SEL_MINUS on line 613. OR gate 620 passes a true value if any of AND gates 614–616 output a true signal.

Figure 7:
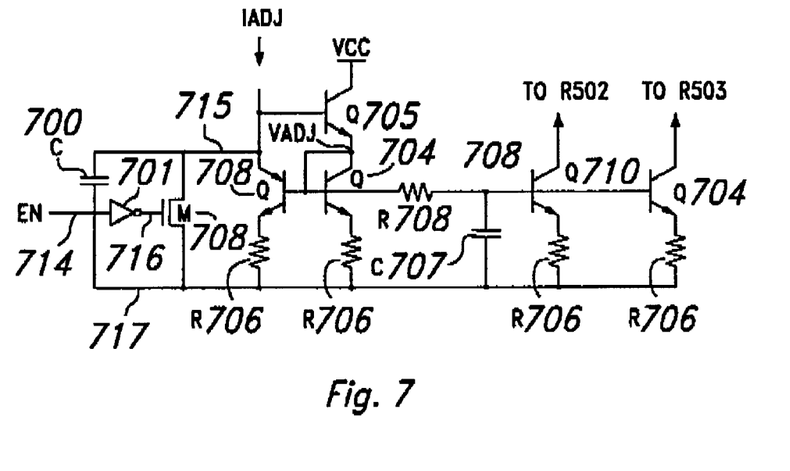
FIG. 7 is a circuit diagram of one embodiment of variable current source circuitry for providing variable window width in a window generator circuit.

FIG. 7 is a circuit diagram of an embodiment of the variable current sources from the window generator circuits of FIGS. 5A and 5B. The circuit comprises bipolar junction transistors Q703, Q704, Q705, Q710 and Q711, capacitors C700 and C709, resistors R706, R707, R708, R712 and R713, inverter 701 and MOSFET M702. The circuit is constructed as follows.

Current input IADJ, such as from DAC 206 of FIG. 2, is provided to node 715. Node 715 interconnects the base of transistor Q705, the collector of transistor Q703 and the drain of MOSFET M702. Further, capacitor C700 is coupled between node 715 and the lower power supply node 717. The collector of transistor Q705 is coupled to the upper power supply labeled VCC. The emitter of transistor Q705 represents control voltage VADJ, and is coupled to the base junctions of transistors Q703 and Q704, and coupled to the collector of transistor Q704. The emitters of transistors Q703 and Q704 are coupled through resistors R706 and R707, respectively, to lower supply node 717. The source of MOSFET M702 is coupled to lower supply node 717, and the gate of MOSFET M702 is coupled to the output of inverter 701. Enable signal EN 714 is provided to the input of inverter 701.

The base of transistor Q704 (VADJ) is coupled through resistor R708 to the base junctions of transistors Q710 and Q711, labeled node 718. Capacitor C709 is coupled between node 718 and node 717. The emitters of transistors Q710 and Q711 are coupled through resisters R712 and R713, respectively, to lower supply node 717. The collector of transistor Q710 is coupled to resistor R502 from FIG. 5A or to resistor R509 of FIG. 5B. The collector transistor Q711 is coupled to resistor R503 of FIG. 5A or resistor R511 of FIG. 5B.

Transistors Q703 and Q704 form what are referred to as current mirrors. The input current IADJ flows through transistor Q703. A proportional current is induced in transistor Q704 due to the sharing of the base voltage VADJ. The voltage VADJ is further provided to node 718 to control the current through transistors Q710 and Q711 in a similar current mirroring process. However, resistor R708 and capacitor C709 act as a low pass filter between the control voltage VADJ and node 718. The low pass filtering rejects spurious high frequency voltage signals at node 718 to provide stable current through transistors Q710 and Q711.

MOSFET M702 is turned on by inverter 701 when enable signal 714 is false, i.e., at a low voltage corresponding to a logical zero. When MOSFET M702 is turned on, a low impedance path is created between node 715 and node 717, shunting current away from transistor Q703 and disabling the mirrored currents in transistors Q704, Q710 and Q711. When enable signal 714 is true, inverter 701 shuts off MOSFET M702, permitting control current IADJ to flow through transistor Q703.

Figure 8A:
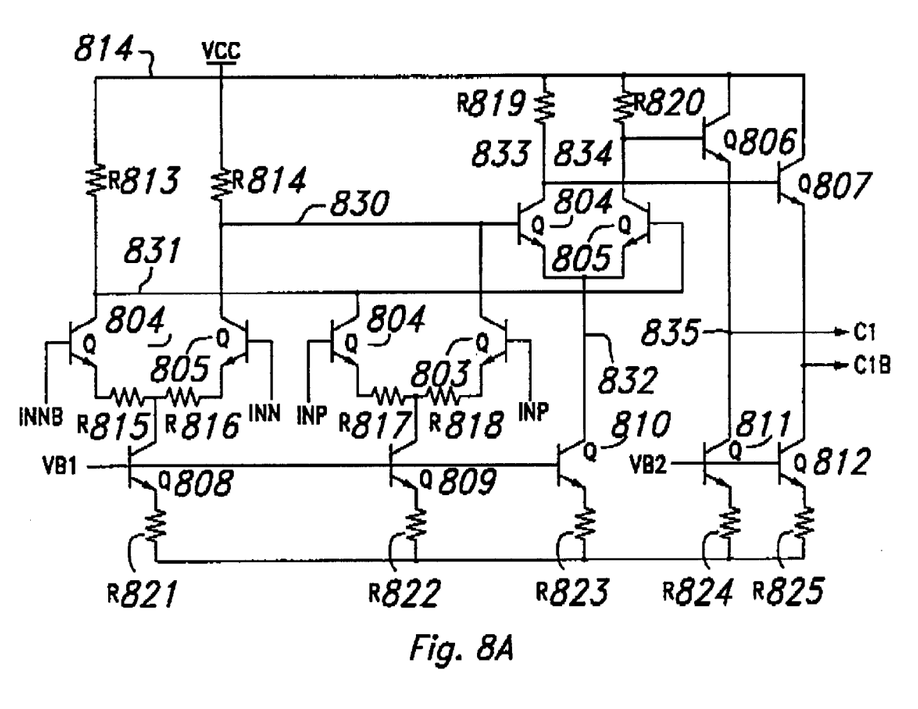
Figure 8B:
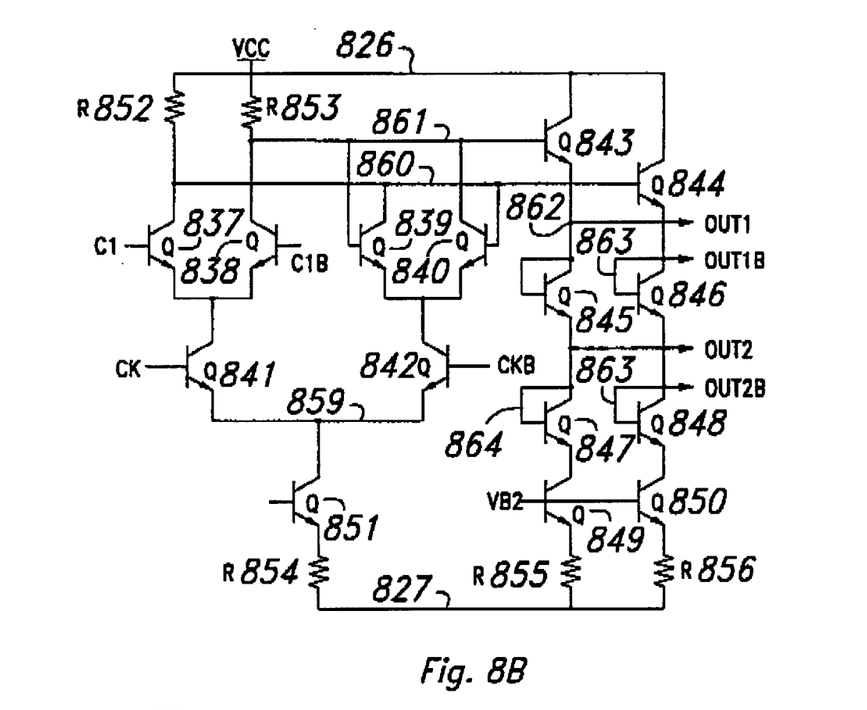

FIGS. 8A and 8B together form an embodiment of a differential comparator circuit. FIG. 8A comprises two emitter degenerated differential-pair amplifier input stages coupled in parallel to a common load, followed by a third differential pair amplifier with emitter follower outputs. FIG. 8B comprises a clocked circuit wherein during a first clock phase, a differential pair amplifier coupled to emitter follower outputs form the final stage of the comparator, outputting a dynamic comparison signal. During a second clock phase, the final stage of the comparator is shut off, and a cross-coupled differential amplifier is turned on. The cross-coupled amplifier employs feedback to effectively latch the comparator value generated in the final stage of the comparator during the previous clock phase. A stable output is thus provided during the second clock phase.

In the differential comparator, the positive input of the comparator accepts a differential input comprising positive input INP and negative INPB. The negative input of the comparator accepts a differential input comprising positive input INN and negative input INNB. In FIG. 8A, inputs INNB, INN, INP and INPB are coupled to the base junctions of transistors Q800, Q801, Q802 and Q803, respectively. The emitters of transistors Q800 and Q801 are coupled through resistors R815 and R816, respectively, to node 828. The emitters of transistors Q802 and Q803 are coupled through resistors R817 and R818, respectively, to node 829.

The collectors of transistors Q800 and Q802, jointly labeled as node 831, are coupled to the base of transistor Q805 and through resistor 813 to power supply node 826. The collectors of transistors Q801 and Q803, jointly labeled as node 830, are coupled to the base of transistor Q804 and through resistor 814 to power supply node 826. The emitters of transistors Q804 and Q805 are jointly coupled to node 832. The collector of transistor Q804, labeled node 833, is coupled to the base of transistor Q807 and through resistor R819 to power supply node 826. The collector of transistor Q805, labeled node 834, is coupled to the base of transistor Q806 and through resistor R820 to power supply node 826.

The collectors of transistors Q808, Q809 and Q810 are coupled to nodes 828, 829 and 832, respectively. The emitters of transistors Q808, Q809 and Q810 are coupled through resistors R821, R822 and R823, respectively, to lower supply node 827. Bias voltage VB1 is provided to the base junctions of transistors Q808–Q810.

The emitters of transistors Q806 and Q807, labeled nodes 835 and 836, respectively, are coupled to the collectors of transistors Q811 and Q812, respectively. The emitters of transistors Q811 and Q812 are coupled through resistors 824 and 825, respectively, to lower supply node 827. Bias voltage VB2 is provided to the base junctions of transistors Q811 and Q812 to regulate current. The intermediate output of the circuit of FIG. 8A is the differential signal comprising signal C1 taken from node 835 and signal C1B taken from node 836. Signals C1 and C1B are provided as inputs to the circuit of FIG. 8B.

In FIG. 8B, signals C1 and C1B are provided to the base junctions of transistors Q837 and Q838, respectively. The emitters of transistors Q837 and Q838, and the collector of transistor Q841 are coupled to node 857. The collectors of transistors Q837 and Q838 are coupled to nodes 860 and 861, respectively. Nodes 860 and 861 are further coupled through resistors R852 and R853, respectively, to upper power supply node 826. A differential clock signal comprising positive clock signal CK and negative clock signal CKB, is provided to the circuit for timing purposes. Signal CK is provided to the base of transistor Q841 and signal CKB is provided to the base of transistor Q842.

The emitters of transistors Q841 and Q842 are coupled to node 859. The collector of transistor Q842 and the emitters of transistors Q839 and Q840 are coupled to node 858. The collector of transistor Q839 and the base of transistor Q840 are coupled to node 860. The collector of transistor Q840 and the base of transistor Q839 are coupled to node 861. The collector of transistor Q851 is coupled to node 859, and the emitter of transistor Q851 is coupled through resistor R854 to lower power supply node 827. Bias voltage VB1 is provided to the base of transistor Q851.

The collectors of transistors Q843 and Q844 are coupled to upper power supply node 826. The base junctions of transistors Q843 and Q844 are coupled to nodes 861 and 860, respectively. The emitters of transistors Q843 and Q844 are coupled to nodes 862 and 863, respectively. The base and collector junctions of transistor Q845 are coupled to node 862. The base and collector junctions of transistor Q846 are coupled to node 863. The emitter of transistor Q845 and the base and collector junctions of transistor Q847 are coupled to node 864. The emitter of transistor Q846 and the base and collector junctions of transistor Q848 are coupled to node 865. The collectors of transistors Q849 and Q850 are coupled to the emitters of transistors Q847 and Q848, respectively. The emitters of transistors Q849 and Q850 are coupled through resistors R855 and R856, respectively, to the lower power supply node 827. Bias voltage VB2 is provided to the base junctions of transistors Q849 and Q850.

A differential output signal of the comparator circuit comprises the positive signal OUT1, taken from node 862, and the negative signal OUT1B, taken from node 863. A second level shifted differential comparator output comprises positive signal OUT2, taken from node 864, and negative signal OUT2B, taken from node 865. In this embodiment, the amount of level shifting between the first and second outputs of the differential comparator is equivalent to one diode voltage drop. One of the differential output signals from the comparator is provided to digital logic within qualifying logic 114, as shown in FIGS. 1 and 6.

FIG. 9 is a diagram of an embodiment of the slicer circuit and the window comparator. Window comparator 204 and sample-and-hold circuit 202 receive data signal 200 from the read channel filter. Window comparator 204 compares data signal 200 with an upper threshold voltage defining the boundary between a "+1" value and a "0" value, and a lower threshold voltage 10 defining the boundary between a "−1" value and a "0" value. The comparison results are latched during the negative phase of clock signal 907, as with the comparator circuit of FIGS. 8A and 8B.

The comparison results are output on lines 105, individually labeled as signal 600, representing the upper threshold comparison value, and signal 601, representing the lower threshold comparison value. A logical "1" on signal 600 indicates that the data signal is greater than the upper threshold voltage. A logical "1" on signal 601 indicates that the data signal is less than the lower threshold voltage. For circuits with more valid signal values (e.g., expanded to include +2 and −2, etc.), the data signal is compared with further thresholds defining the boundaries between the further contiguous regions (+1 and +2, −1 and −2, etc.). The added comparison outputs would also be provided as part of signals 105. Signals 105 are output to selection logic 900 for decoding purposes, and to phase detector circuitry (not shown) for clock recovery purposes.

Signals 600 and 601 are provided to selection logic 900 for decoding into plus signal 904, zero signal 905 and minus signal 906. In this embodiment, selection logic 900 is equipped with one output corresponding to each possible data region (0, ±1, ±2, etc.). The corresponding output is asserted when the appropriate combination of comparison values is received from comparator 204. The selection logic may be combined with the multiplier or multiplexer logic of block 901. The decoding function for this embodiment is as follows:

| +1 | −1 | plus | zero | minus |
|----|----|------|------|-------|
| 0  | 1  | 0    | 0    | 1     |
| 0  | 0  | 0    | 1    | 0     |
| 1  | 0  | 1    | 0    | 0     |

Signals 904–906 of selection block 900 are provided to corresponding; inputs of multiplier 901. An analog signal corresponding to the ideal "+1" (or, alternatively, "−1") is provided to multiplier 901 as input signal 903. Other ideal values may be provided for other embodiments, such as an ideal "+2" value, or other values may be derived from the ideal "+1" value. Multiplier 901 multiplies ideal input 903 by +1, 0 or −1, depending on whether inputs plus 904, zero 905 or minus 906, respectively, are asserted. In an alternate embodiment, multiples of the ideal input are generated with voltage doubling and multiplying circuits such as those known in the art. Multiplexing circuitry performs the selecting function.

In an embodiment of multiplier 901 wherein the analog signal is differential, the determination of whether the output value is positive or negative is made by selecting the appropriate polarity of the differential lines. A zero value may be achieved by shorting the two differential lines together.

The output of multiplier 901 represents the ideal voltage value for the voltage region(+1, 0 or −1) containing the data signal. This ideal voltage value is provided as signal 101 to the negative input of slicer comparator 902, and to the VREF input of a MWRL circuit in a channel quality monitor.

The positive input of slicer comparator 902 is coupled to sample-and-hold circuit 202 to receive delayed data signal 100. Clock signal 907 is provided to comparator 902 for latching of the comparison result during one phase of the clock period. Slicer comparator 902 typically receives a clock signal of opposite polarity from the clock signal received by window comparator 204.

Output 908 from comparator 902 indicates whether the respective data sample is above or below the ideal input voltage value for the voltage region wherein it lies. In one embodiment, the variation of the input samples from the ideal voltage levels is utilized to provide feedback information to the automatic gain control (AGC) circuitry and to the channel filtering/equalizing circuitry.

Figure 10A:
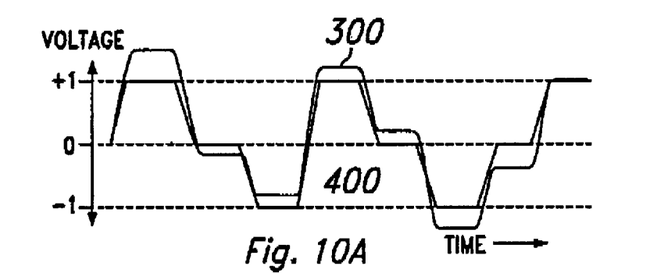
FIG. 10A is a waveform diagram of the input signals of the slicer comparator.

FIG. 10A is a waveform diagram of the inputs of slicer comparator 902. Waveform 300 represents the delayed data signal 100 at the positive input, and waveform 1000 represents the ideal signal 101 at the negative input. As shown, waveform 300 transitions between values in the +1, 0 and −1 voltage ranges, but typically settles above or below the ideal voltage level in each range. Waveform 1000 tracks waveform 300, by assuming the ideal voltage for each voltage range wherein waveform 300 resides during each clock cycle. The directional variation (either greater than or less than) of waveform 300 from the target waveform can therefore be determined by comparing the voltages of waveforms 300 and 1000 during each clock cycle.

Figure 10B:
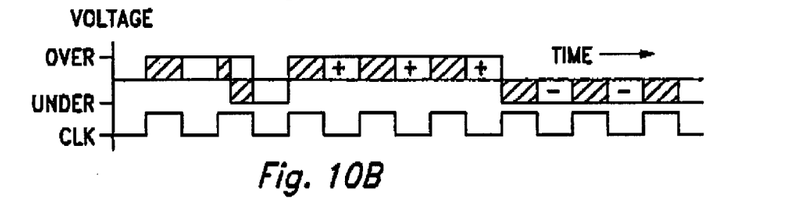
FIG. 10B is a waveform diagram of the slicer comparator output signal corresponding to the input waveforms of FIG. 10A.

FIG. 10B is a symbolic waveform diagram of the output of slicer comparator 902 with reference to an input clock signal. The output waveform is identified as waveform 1001. During one phase of the clock waveform, waveform 1001 is the unlatched, transparent output of comparator 902, identified by cross-hatching in the waveform. During the opposite clock phase, comparator 902 latches the output, providing a stable waveform in those regions of waveform 1001 identified with a "+" or a "−". The "+" symbol indicates that the comparator output is positive, and that the data input is above the ideal voltage value for the respective clock cycle. The "−" symbol indicates that the data input is under the ideal voltage value for the respective clock cycle. The latched output waveform 1001 in effect represents a one-bit digitized error associated with the data signal.

If the outer values (in this case, +1 and −1) are consistently above upper ideal voltage value (+1) and below the lower ideal voltage value (−1), the AGC system will reduce the gain of the AGC amplifier to move the sampled values closer to the ideal values. With respect to the filtering/equalizing of the channel, the channel filter/equalizer is an adaptive filter for shaping the input data into the desired waveform (e.g., EEPR4). The error information provided by the output of slicer comparator 902 is used in the LMS (least mean squared algorithm) update circuit to tune filter coefficient values.

Figure 11:
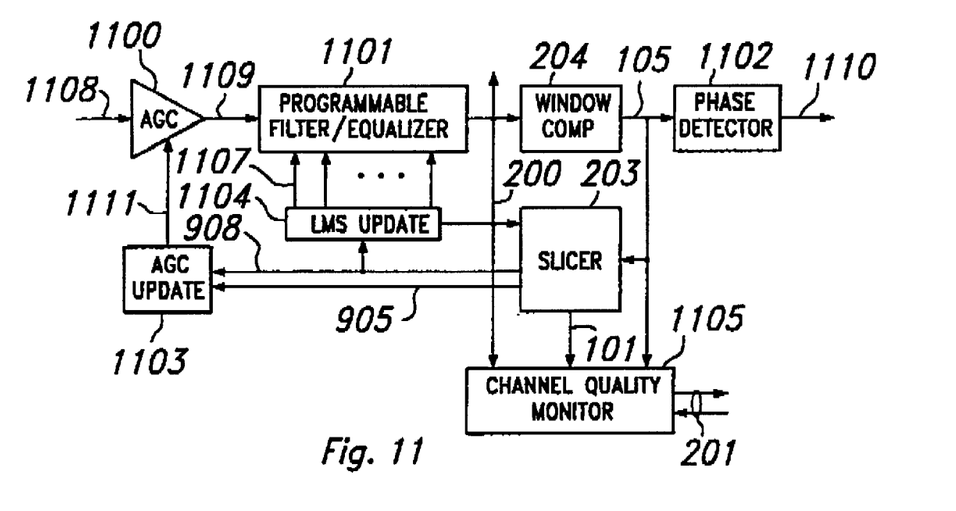
FIG. 11 is block diagram of an embodiment of a read channel comprising an AGC loop, and LMS filter update loop, and a channel quality monitor circuit.

FIG. 11 is a circuit block diagram of a read channel comprising an AGC system, a programmable filter/equalizer with LMS update, and circuitry for clock recovery and channel quality monitoring. Channel input signal 1108 is provided to AGC amplifier 1100. AGC update block 1103 is coupled to AGC amplifier 1100 to adjust the gain of the amplifier via signal 1111. The amplified output signal 1109 from AGC amplifier 1100 is provided to programmable filter/equalizer 1101. The output of filter 1101 is data signal 200, which is provided to window comparator 204, slicer 203, LMS update block 1104, channel quality monitor 1105, and other portions of the read channel (e.g., a PRML detector). LMS update block 1104 is coupled to filter 1101 to provide adaptive tuning of filter coefficients via update signals 1107.

Window comparator 204 provides window information signals 105 to phase detector 1102, slicer 203 and channel quality monitor 1105. Phase detector 1102 is coupled to further clock recovery circuitry via line 1110. Slicer 203 provides slicer comparator output 908 to AGC update block 1103 and LMS update block 1104, zero signal 905 to AGC update block 1103, and ideal reference signal 101 to channel quality monitor 1105. Channel quality monitor 1105 interfaces with serial port 201 for monitor output and control purposes.

AGC update block 1103 discards the 0 valued comparison values from signal 908 when zero signal 905 is asserted. The remaining +1 and −1 values from signal 908 are used to drive a charge pump. The charge pump feeds a lowpass filter which provides the AGC control voltage on line 1111. When the data signal is above the ideal +1 or below the ideal −1, the charge pump provides less charge, and the AGC control voltage drops, reducing the AGC gain. When the data signal is below the ideal +1 or above the ideal −1, the charge pump provides more charge and the AGC gain increases over time to bring the data signal to the desired levels.

LMS update block 1104 uses data signal 200 and slicer output 908 in the coefficient update algorithm for filter/equalizer 1101. The gradient of data signal 200 is calculated and used to update the filter tap coefficients via lines 1107.

The embodiment of FIG. 11 provides greater efficiency in hardware utilization by driving the AGC circuit, the LMS update circuit, and the channel quality monitoring circuit from the single slicer circuit. Further, by using an ideal moving reference for comparison operations in the slicer and channel quality monitor, the number of comparator circuits required is reduced. Efficient apparatus are thus provided for monitoring, adapting and tuning the read channel.

Thus, a moving reference channel quality monitor for read channels has been described.

We claim:

1. A circuit comprising:

a channel having a data signal;

a slicer providing an ideal moving reference signal which tracks an ideal value of said data signal across a plurality of voltage levels over time;

a window generator receiving said ideal moving reference signal and providing an upper signal and a lower signal defining a window substantially centered upon said ideal moving reference signal;

comparing means receiving said upper signal, said lower signal and said data signal, said comparing means generating an output signal dependent on a voltage position of said data signal relative to said window; and a counter coupled to said output of said comparing means to track a number of times said data signal falls within said window.

2. The circuit of claim 1 further comprising qualifying logic coupled between said comparing means and said counter, said qualifying logic passing said output to said counter when said window matches a selected window.

3. The circuit of claim 2 wherein said qualifying logic further comprises means for inverting said output.

4. The circuit of claim 1 further comprising a serial port coupled to said counter.

5. The circuit of claim 4 wherein said window has an adjustable width, and wherein said window generator is coupled to said serial port for control of said adjustable width.

6. The circuit of claim 1 wherein said slicer comprises a comparator for comparing said data signal with said ideal moving reference signal to generate an error output.

7. The circuit of claim 6 wherein said slicer further comprises:

a window comparator receiving said data signal and generating a digital signal representing said data signal; and a multiplier coupled to said window comparator, said multiplier receiving a voltage reference and generating said ideal moving reference signal based on said voltage reference and said digital signal.

8. The circuit of claim 6 wherein said channel further comprises:

an AGC tuning loop receiving said error output; and an LMS filter tuning loop receiving said error output.

9. A method for monitoring a channel quality comprising the steps of:

generating an ideal moving reference voltage;

generating a reference window around said ideal moving reference voltage;

comparing a data signal with said reference window;

producing a match signal when said data signal is within said reference window; and incrementing a counter during a read cycle when said match signal is asserted.

10. The method of claim 9 further comprising the step of inverting said match signal.

11. The method of claim 9 further comprising the step of adjusting a width of said reference window.

12. The method of claim 9 further comprising the step of reading said counter via a serial port.

13. The method of claim 9 further comprising the step of tuning said channel to minimize the count of said counter.

14. The method of claim 9 further comprising the step of qualifying said match signal based on whether said reference window corresponds to a selected window.

15. A circuit comprising:

a window comparator receiving a data signal and determining a most likely ideal voltage for said data signal from a plurality of ideal voltages;

a multiplier coupled to said window comparator, said multiplier receiving an ideal reference voltage and generating an ideal moving reference voltage from said most likely ideal voltage; and comparing means receiving said ideal moving reference voltage and said data signal, said comparing means generating an output based on a location of said data signal with respect to a voltage region determined by said ideal moving reference voltage.

16. The circuit of claim 15 wherein said voltage region comprises a window centered on said ideal moving reference voltage.

17. The circuit of claim 16 further comprising a counter coupled to said comparing means to track a number of occurrences wherein said data signal is located within said window.

18. The circuit of claim 16 wherein said window has a variable width.

19. The circuit of claim 15 wherein said region comprises voltage values to one side of said ideal moving reference voltage.

20. The circuit of claim 19 further comprising an AGC loop driven by said output of said comparing means.

21. The circuit of claim 19 further comprising a filter tuning loop receiving said output of said comparing means.

* * * * *